United States Patent [19]
Zejda et al.

[11] Patent Number: 4,943,363
[45] Date of Patent: Jul. 24, 1990

[54] CATHODE SPUTTERING SYSTEM

[75] Inventors: Jaroslav Zejda, Rodenbach; Manfred Schuhmacher, Alzenau-Michelbach, both of Fed. Rep. of Germany

[73] Assignee: Leybold Aktiengesellschaft, Fed. Rep. of Germany

[21] Appl. No.: 377,132

[22] Filed: Jul. 10, 1989

[30] Foreign Application Priority Data

Apr. 14, 1989 [DE] Fed. Rep. of Germany ....... 3912295

[51] Int. Cl.$^5$ ............................................. C23C 14/34
[52] U.S. Cl. ........................... 204/298.15; 204/192.12; 414/222
[58] Field of Search ............... 204/192.12, 298 WH, 204/298 SC, 298 MC, 298 MD, 298 MB, 298 MR, 298 MO, 298 EM; 414/217, 219, 222, 223, 225

[56] References Cited

U.S. PATENT DOCUMENTS

| | | | |
|---|---|---|---|
| 3,532,072 | 10/1970 | Kiwiet | 118/301 |
| 3,664,948 | 5/1972 | Graffeo, Jr. et al. | 204/298 |
| 3,904,930 | 9/1975 | Waldron et al. | 317/3 |
| 4,313,815 | 2/1982 | Graves, Jr. et al. | 204/298 MC |
| 4,315,705 | 2/1982 | Flint | 414/222 |
| 4,433,951 | 2/1984 | Koch et al. | 414/222 X |
| 4,500,407 | 2/1985 | Boys et al. | 204/298 |
| 4,548,699 | 10/1985 | Hutchinson et al. | 414/222 X |
| 4,584,045 | 4/1986 | Richards | 414/222 X |
| 4,595,483 | 6/1986 | Mahler | 204/192.12 X |
| 4,620,359 | 11/1986 | Charlton et al. | 414/223 X |
| 4,670,126 | 6/1987 | Messer et al. | 204/298 MC |
| 4,770,590 | 9/1988 | Hugues et al. | 414/172 |
| 4,808,291 | 2/1989 | Denton et al. | 204/298 |
| 4,816,116 | 3/1989 | Davis et al. | 204/298 MC |

FOREIGN PATENT DOCUMENTS

| | | |
|---|---|---|
| 3306870 | 8/1984 | Fed. Rep. of Germany . |
| 3413001 | 1/1985 | Fed. Rep. of Germany . |
| 3513137 | 12/1985 | Fed. Rep. of Germany . |
| 3717712 | 12/1988 | Fed. Rep. of Germany . |
| 500768 | 2/1971 | Switzerland . |

OTHER PUBLICATIONS

Siegle, Gert, "*Herstellung dunner Metallschichten durch Kathodenzerstaubung*", mrv. Metallpraxis/Oberflachentechnik, pp. 247-254.

*Primary Examiner*—Nam X. Nguyen
*Attorney, Agent, or Firm*—Hill, Van Santen, Steadman & Simpson

[57] ABSTRACT

A cathode sputtering system for coating substrates in a vacuum chamber in which a rotating substrate carrier is accommodated and comprises at least one conveyor spoon. The conveyor spoon comprises a substrate receptacle member and an arm attached between the receptacle member and a rotating disk. The arm preferably comprises two leaf springs arranged parallel to one another. During the sputtering process, a pressure plate presses the substrate receptacle member and the substrate against a mask that is part of the cathode station. As a result, a cathode vacuum space is formed that is isolated from the vacuum space of the system.

18 Claims, 4 Drawing Sheets

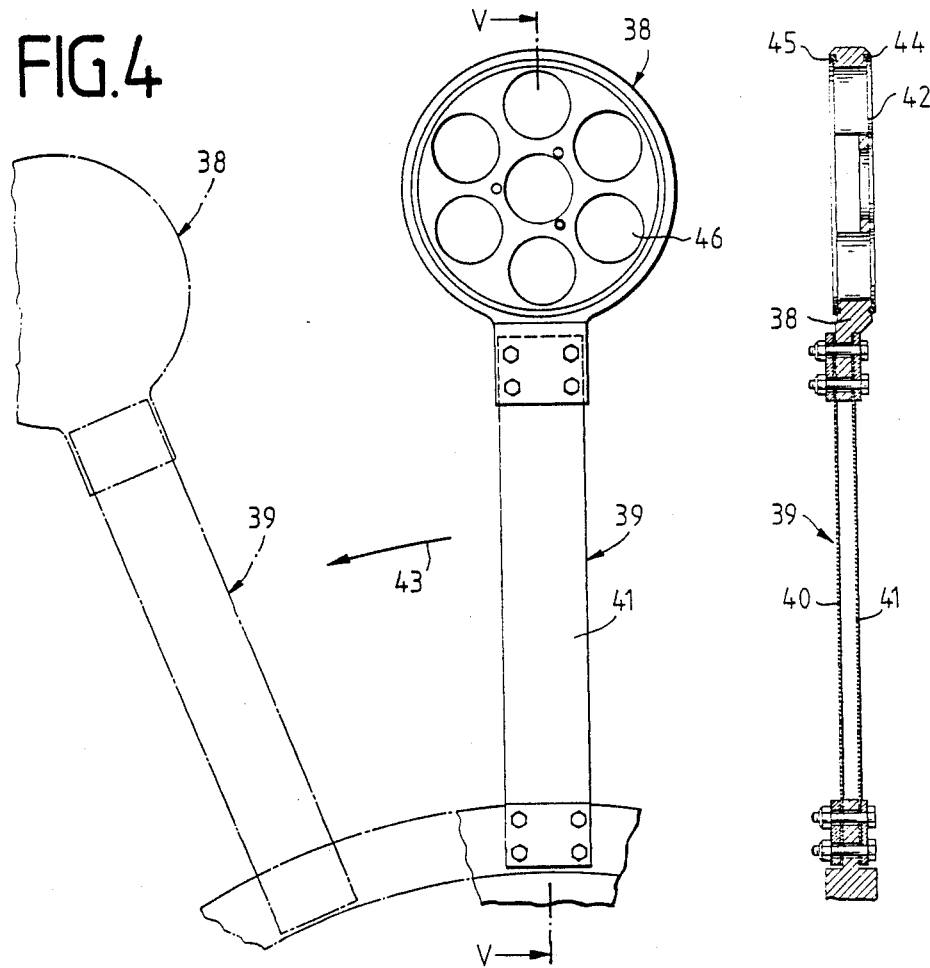

CATHODE SPUTTERING SYSTEM

BACKGROUND OF THE INVENTION

The present invention generally relates to cathode sputtering systems. More specifically, the invention relates to a cathode sputtering system for coating substrates in a vacuum chamber within which is accommodated a rotating substrate carrier, the system including at least one cathode station, a loading station, and an unloading station.

The coating of substrates, for example, of compact disks (CDs) is known in vacuum process technology, particularly in thin-film technology. Compact disks are a modern storage medium for digital information. In a sputtering process, imprinted plastic disks are coated with a layer, for example, an aluminum layer having a thickness of less than one ten-thousandths of a millimeter.

The sputtering-coating systems employed for this purpose include annularly constructed process chambers. Robots load and unload the systems via sluices in clean rooms. Substrate carriers convey the substrates through the annular process chambers. High-power sputtering cathodes, usually constructed as magnetrons, effect the sputtering.

Such a system is disclosed in a brochure numbered 12710.01 and produced by Leybold-Heraeus GmbH. This known cathode sputtering system provides single-sided coating of a laser-reflecting aluminum layer. The system includes an annular, horizontally arranged, vacuum chamber with loading and unloading stations, a high-power sputtering cathode, a conveyor ring comprising a disk receptacle, and dynamic sluices for isolating the coating chamber from the loading and unloading station.

The disk receptacle is employed to convey the substrates from the loading and unloading station to the cathode station and back. The processing, however, is extremely involved and expensive.

SUMMARY OF THE INVENTION

The present invention provides an improved cathode sputtering system. In so doing, the invention provides a cathode sputtering system which accommodates a plurality of cathode stations, measuring stations, and other stations having different functions such as loading and unloading the system with substrates at the vacuum chamber.

Further, the invention provides for a space saving system wherein vacuum, cooling water, power, and compressed air connection lengths are minimized. Thus, a frame for mounting or holding the system can also serve as a rack o carrier for the lines supplying these connections.

Yet further, the invention provides a sputtering system wherein the vacuum chamber is easily accessible from all sides. Thus, in particular, maintenance work, replacement work, and repair work can be simply performed at large lateral surfaces of the vacuum chamber.

The system of the invention occupies a minimal amount of space. In this regard, it is possible to directly couple the sputtering system of the invention to other fabricating systems in a manufacturing flow.

More specifically, the invention provides improved protection against sputter coating of parts of the substrate conveyor means.

Additionally, the conveyor means is constructed so as to be lightweight. Accordingly, a large conveyor means drive need not be employed.

As a result of the invention, extremely good and reliable isolation of a cathode vacuum space from the remaining vacuum space of the system is possible during the sputtering process.

To these ends, the present invention provides a cathode sputtering system employing a substrate carrier comprising at least one so-called conveyor spoon. A conveyor spoon derives its name from its shape, viz, an arm and a receptacle member attached thereto for accepting an item.

In a preferred embodiment, the conveyor spoon includes a substrate receptacle member that is movable in a direction along the axes of the cathode station, loading station, and unloading station.

It has proven to be particularly expedient that the conveyor spoon comprise a substrate receptacle member that is fashioned in the shape of a circular disk and of a radially extending arm such that a plane of the receptacle member, while rotating, is always aligned parallel to planes of the parts of the system cooperating with it, specifically those of the sputtering cathode, the loading station, and the unloading station.

The arm preferably is fashioned to be elastically mobile. To this end, the arm preferably comprises a resilient component part.

Yet more specifically, the arm preferably comprises a guide system composed of two arm elements arranged parallel to each other, the arm elements comprising leaf springs.

Concentration of the sputtered material onto the substrate is made possible by means of a mask that is arranged between the cathode and the substrate receptacle member and substrate. The receptacle member and the substrate being pressed against the mask by means of the pressing member.

Further in the preferred embodiment, it is provided that appropriate parts of the cathode station, the substrate receptacle member, the pressure member formed as a pressure plate, and, in particular, the mask, form a vacuum space that can be isolated vacuum-tight from the remainder of the vacuum chamber of the cathode sputtering system.

Isolation of the space of the vacuum cathode station from the remainder of the vacuum coating chamber is achieved in that the substrate receptacle member is fashioned pressable against the cathode station. A pressure member is provided for biasing/pressing the receptacle member against a portion of the cathode station.

Similarly, the substrate receptacle member is pressable against appropriate parts of the loading and unloading stations so as to provide vacuum-tight isolation spaces at these stations as well.

The conveyor spoons preferably are rotated by means of a drive mechanism that is centrally coupled thereto. One or more conveyor spoons mounted on the transport are then rotated in discrete increments, i.e., stepped fashion within the vacuum chamber.

It can be appreciated that the inventions can be practiced in vacuum chambers that are mounted horizontally or in any other orientation. In the preferred embodiment, however, the vacuum chamber is vertically oriented, and thus, the conveyor spoons rotate about a horizontal axis.

In order to provide gas streams that occur in the region about the substrate receptacle member with low flow resistance, and in order to reduce the overall weight of the receptacle member, the receptacle member preferably comprises a circular plate having a plurality of circular recesses therein. The circular recesses reduce the amount of material employed while providing greater flow paths for the gases.

Accordingly, an advantage of the invention is an improved cathode sputtering system, particularly as described above.

Another advantage is a system that permits the employment of a plurality of cathode stations, as well as a plurality of loading stations and unloading stations.

These and other advantages will become apparent from the following description of the preferred embodiment thereof, taken in conjunction with the accompanying drawings.

BRIEF DESCRIPTION OF THE DRAWINGS

In the drawings:

FIG. 3 is an illustration of a conveyor spoon that can be employed in the system of FIG. 1;

FIG. 4 is an illustration of the conveyor spoon of FIG. 3 after the conveyor spoon has been rotated through a defined angle;

FIG. 5 is an illustration of a cross-sectional view of the conveyor spoon of FIG. 3 generally taken along the line V—V;

DETAILED DESCRIPTION OF THE PRESENTLY PREFERRED EMBODIMENTS

In FIGS. 1–7, the presently preferred embodiments of the invention are illustrated. The following is a description of these embodiments.

Figure 1:
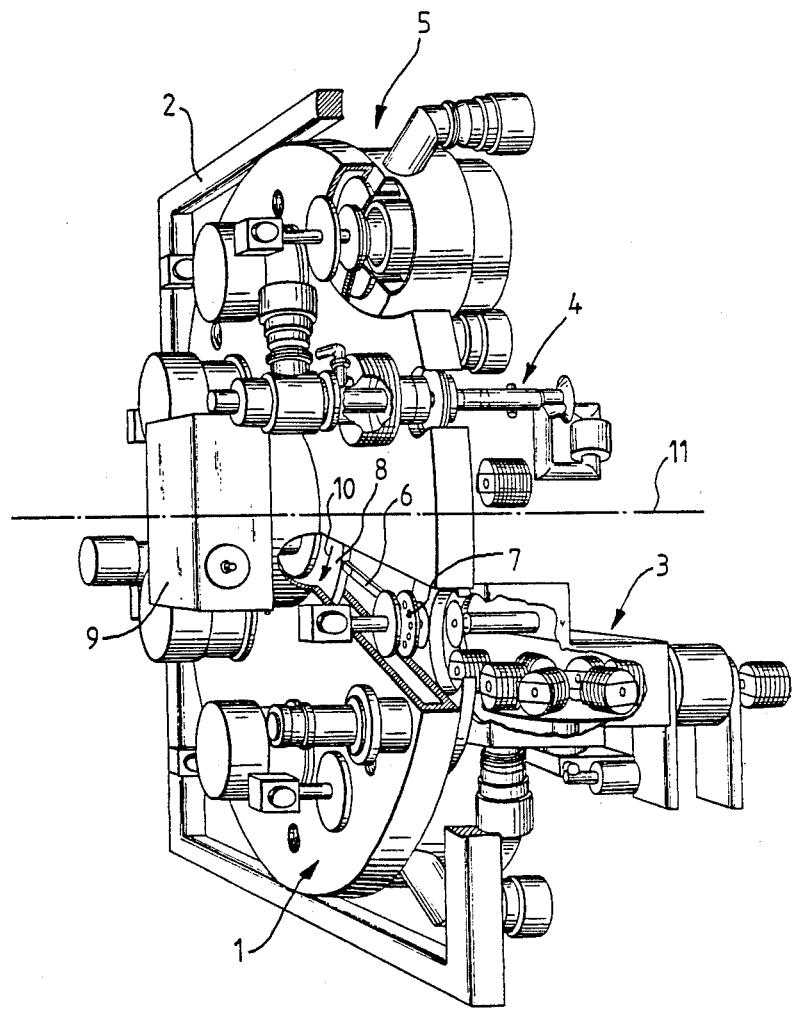
FIG. 1 is an illustration of a perspective view, partially broken away, of a cathode sputtering system embodying principles of the invention.

In FIG. 1, a cathode sputtering system embodying principles of the invention is illustrated in perspective view. As illustrated, the system includes a circular disk-shaped vacuum chamber 1 that is accommodated and mounted within a frame or stand 2. Cooperating loading station 3 and unloading station 4 are operatively positioned in communication with the vacuum chamber 1, as is a cathode station 5 (illustrated in a broken away view). The stations 3–5 are described more fully below in connection with descriptions of the other figures.

In FIG. 1, the vacuum chamber 1 is illustrated in a partially broken away view so that a conveyor spoon composed of an arm and of a substrate receptacle member 7 is visible. The arm 6 is attached to a central conveyor disk 8. The disk 8 is rotated by an appropriate drive mechanism 9. The disk 8 is rotated through defined angles from station-to-station, step-by-step, in the direction of the arrow 10.

As can be seen in FIG. 1, the drive mechanism 9 is centrally arranged with respect to the vacuum chamber 1. The center of the vacuum chamber 1 is defined by a central axis 11.

Figure 2:
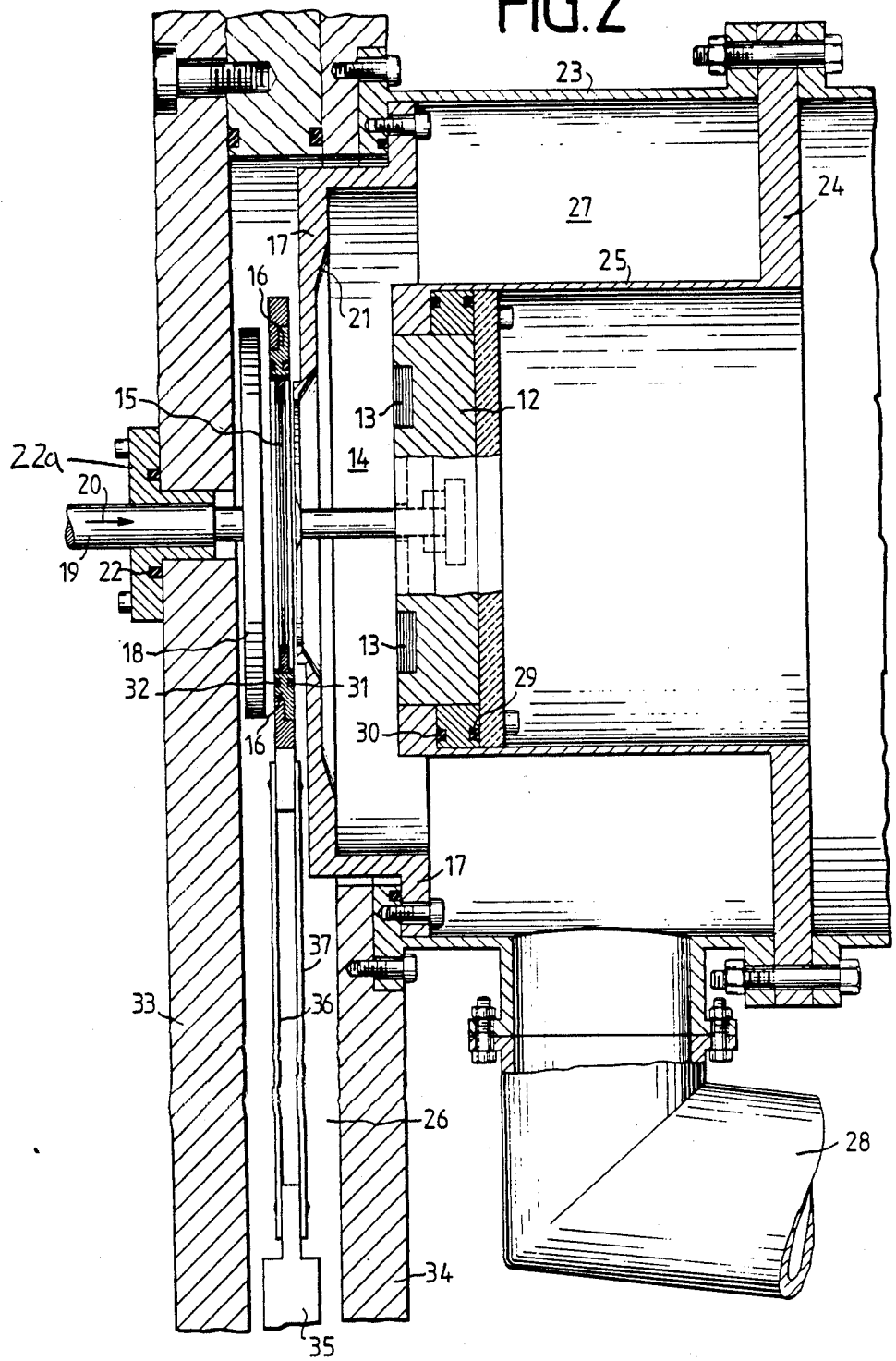
FIG. 2 is an illustration of a cross-sectional view of a sputtering cathode employed by the system of FIG. 1.

In FIG. 2, a cathode station 5 is illustrated in greater detail. Therein, the cathode 12 can be seen.

As illustrated, the cathode 12 encompasses therein a target 13. Accordingly, the cathode 12 is a high-power cathode, a magnetron cathode.

During operation of the cathode 12, plasma is condensed by the magnetic field of the magnetron cathode formed in a region 14 in front of the cathode 12. Positively charged ions from the plasma bombard the target 13. In response, particles of material sputter from the target 13. The sputtered material proceeds onto a substrate 15. However, the sputtered material must pass through a mask 17 arranged between the cathode 12 and the substrate 15 and a substrate receptacle member 16.

It can be appreciated that during the sputtering process, the substrate receptacle member 16 and the substrate 15 are biased against the mask 17 by means of a pressure plate 18. The substrate receptacle member 16 and the substrate 15 are so biased in the direction of an arrow 20.

It can further be appreciated that the sputtered material is concentrated onto the substrate 15. Due to the employment of the mask 17 and the pressure plate 18, sputtering of the sputter material onto the substrate receptacle member 16 and other parts of the conveyor spoon is avoided.

In FIG. 2, the receptacle member 16 and the other parts of the conveyor spoon are illustrated in shadowed form due to the conical shape of a surface 21 of the mask 17. A good uniformity of layer thickness of the sputtering material is thus achieved due to this shaping, as will be understood by those of skill in the art.

A drive shaft 19 provides the actuation for biasing the pressure plate 18. The drive shaft 19 is sealed against a wall of the vacuum chamber 1 by means of a bushing 22a including an O-ring 22. It is understood that a drive mechanism, not illustrated, causes the shaft 19 to press the plate 18 against the wall of the chamber 1.

Walls 23, 24, and 25 of the cathode station 5, as well as the cathode 12, the mask 17 the substrate receptacle member 16, and the pressure plate 18 form an isolated vacuum space 27 during the sputtering process. The vacuum space 27 is isolated from a remaining vacuum space 26 of the cathode sputtering system by means of the pressure plate 18.

Conduit 28 is coupled between a vacuum source and the space 27. Accordingly, the conduit 28 serves to evacuate the cathode vacuum space 27 and to place same under vacuum pressure. O-rings 29, 30, 31, and 32 serve to seal the cathode vacuum space 27 in an appropriate manner.

Further in FIG. 2, there are illustrated walls 33 and 34 of the vacuum chamber 27 of the cathode sputtering system. Arranged therebetween is a rotatable disk 35 for mounting thereon the arm 6 of the conveyor spoon.

Preferably, as illustrated, the arm 6 comprises two separate arm elements 36 and 37. The arm elements 36 and 37 preferably comprise leaf springs.

It can be appreciated from FIG. 2, that the leaf springs 36 and 37 are arranged in parallel fashion. As a result of this parallel arrangement, the substrate receptacle member 16 is displaceable substantially along an axis parallel to the axis of the rotating disk 35, while maintaining a position perpendicular to said axis, during pressing by the pressing member 18. Accordingly, this displacement can be referred to as parallel displacement. Moreover, the leaf springs 36 and 37 are fashioned of a sufficient length so that no significant shortening of the spoon arm 6 occurs during the pressing event, i.e., there is no significant offset in a radial direction.

An alternative embodiment of this parallel arrangement of the two leaf springs 36 and 37, not illustrated, is possible. In this embodiment, the two parallel arm elements 36 and 37 are articulated such that a plane of the substrate receptacle member 16 remains parallel, during its motion, with respect to those planar parts cooperating with the member 16, or align against the member 16, namely those planar parts of the pressure plate member 18 and of the mask 17.

As can be more greatly appreciated with reference to FIG. 1, the axis 11 is the rotational axis around which the conveyor spoon rotates in discrete increments. The drive element is the conveyor disk 8, which in FIG. 2 is referenced by the reference numeral 35. The rotation or clocking through a specific angle is effected with high precision by means of a precision indexing table, for example, similar to those utilized in machine tool construction.

As illustrated, the substrate 15 is conveyed in discrete steps by the conveyor spoon from the loading station 3 to the cathode stations 5 of the system.

In the illustrated system, the substrate 15 can be coated on one side or on both sides. For two-sided coating, a pair of cathodes 12, such as that illustrated in FIG. 2, are arranged in stations against opposite walls of the vacuum chamber 26. In one station, the cathode is arranged on the wall 34, while in the other station the cathode is arranged on the wall 33.

It can be appreciated that the substrate 15 can be held in an substrate receptacle member 16 in a variety of manners. For example, the substrate 15 can be held in the center of the receptacle member 16 over a central hole. Alternatively, as illustrated in FIG. 2, the substrate 15 can be secured within the receptacle member by means of clamping surfaces that engage an outer circumference of the substrate 15.

In FIGS. 3–5, the conveyor spoon employed in the presently preferred embodiment is illustrated in greater detail. As illustrated, the conveyor spoon comprises a substrate receptacle member 38 and an arm 39. The arm 39 comprises two leaf springs 40 and 41 arranged as described above.

In FIG. 5, a sectional view of the conveyor spoon is illustrated. Situated within the receptacle member 39 is a substrate 42. It should be noted that in FIG. 5, the substrate 42 is positioned towards an axial end of the receptacle member 39. This is on contrast to the more central position of the substrate 15 in FIG. 2.

In FIG. 4, the conveyor spoon of FIG. 3 is illustrated after the spoon has been rotated through a step by the drive shaft 9 of FIG. 1. The spoon is illustrated as having been displaced in the direction of the arrow 43.

O-rings 44 and 45 in FIG. 5 serve to seal the cathode vacuum space 27 in isolation from the remaining vacuum space 26 of the cathode sputtering system.

In FIG. 3 it can be seen that six circular recesses 46 are included within the substrate receptacle 38. It can be appreciated that the weight of the substrate receptacle member 38 is reduced by the inclusion of these circular recesses. Moreover, the flow resistance for gas flowing through the substrate receptacle member 38 is reduced as the size of these recesses increases.

Figure 6:
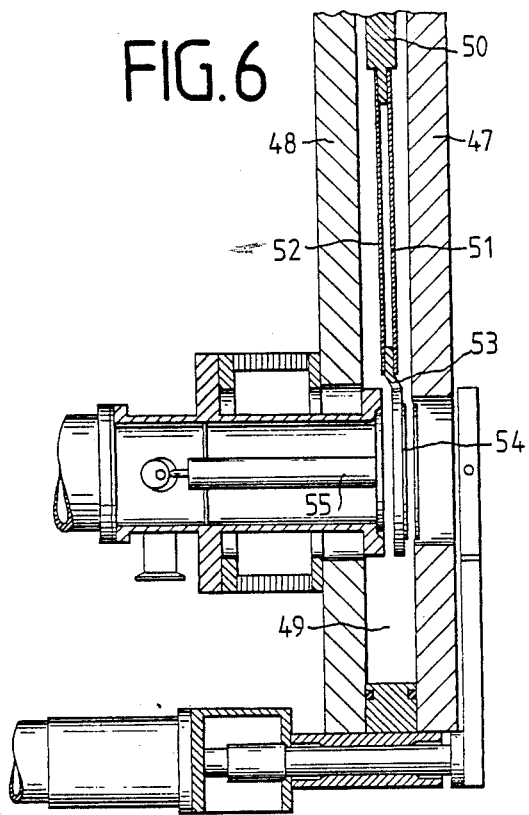
FIG. 6 is an illustration of a cross-sectional view of a portion of an unloading station employed in the system of FIG. 1.

An unloading station 4 is illustrated in greater detail in FIG. 6. As illustrated, walls 47 and 48 form the vacuum chamber 49 of the system. The conveyor disk 50 is appropriately driven by a stepping gear within the vacuum chamber 49. Two leaf springs 51 and 52 form the arm of the conveyor spoon attached to the conveyor pulley 50. An appropriate substrate receptacle member 53 is attached to the leaf springs 51 and 52.

As illustrated in FIG. 6, a substrate 54 is positioned with the substrate receptacle member 53. The substrate receptacle member 53 is biased against the wall 47 by means of a pressing mechanism 55. By means not illustrated, a coated substrate 54 is appropriately removed by the unloading station 4.

Figure 7:
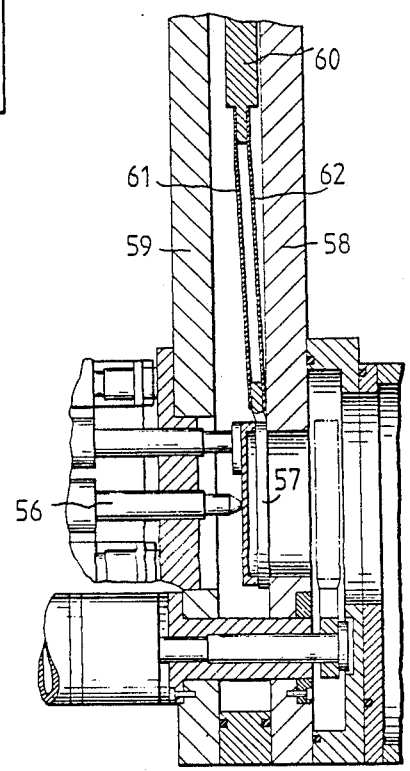
FIG. 7 is an illustration of a cross-sectional view of a portion of a loading station of a system of FIG. 1.

A loading station 3 is illustrated in more detail in FIG. 7. As illustrated, due to the pressing or biasing mechanism 56, a substrate receptacle member 57 is situated in a position wherein it can be pressed against a wall 58 of the vacuum chamber of the system. A second wall 59 forms the other wall of the chamber.

A conveyor disk 60 is appropriately included within the vacuum chamber. Leaf springs 61 and 62 are attached to the conveyor pulley 60 on one end, and on the other end to a receptacle member 57.

In the illustrated position of the substrate receptacle member, it can be appropriately loaded with a substrate from the loading station.

While a preferred embodiment has been shown, modifications and changes may become apparent to those skilled in the art which shall fall within the spirit and scope of the invention. It is intended that such modifications and changes be covered by the attached claims.

We claim as our invention:

1. A cathode sputtering system for coating substrates in a vacuum chamber, comprising:
    a rotating substrate carrier positioned within the chamber, the substrate carrier including at least one conveyor spoon that extends radially from a central axis of the chamber, the conveyor spoon including a substrate receptacle member positioned at a radial end of the spoon, the substrate receptacle member being axially movable along the axis of rotation;
    a sputtering cathode station operatively attached to and in communication with the chamber;
    a loading station operatively attached to and in communication with the chamber; and
    an unloading station operatively attached to and in communication with the chamber.

2. The cathode sputtering system of claim 1, wherein the conveyor spoon comprises a substrate receptacle member that is fashioned as a circular disk and of an arm that is fashioned and arranged such that, while moving, the receptacle member is always aligned parallel to parts of a sputtering cathode of the sputtering cathode station, parts of the loading station, and parts of the unloading station that cooperate with the receptacle member.

3. The cathode sputtering system of claim 2, wherein the arm comprises a resilient member.

4. The cathode sputtering system of claim 3, wherein the arm comprises a guide system composed of two arm elements arranged parallel to one another, the arm elements comprising leaf springs.

5. The cathode sputtering system of claim 2, wherein the substrate receptacle member is fashioned pressable against the sputtering station, and a pressure member is provided for said pressing.

6. The cathode sputtering system of claim 5, wherein a mask is positioned between the cathode and the substrate receptacle member, the receptacle member and the substrate being capable of being pressed against the mask by the pressure member.

7. The cathode sputtering system of claim 6, wherein parts of the cathode station, the mask, the substrate receptacle member, and the pressure member are fashioned as pressure plates to form a vacuum space about the station that is isolated from the remainder of the vacuum chamber of the system.

8. The cathode sputtering system of claim 1, wherein the substrate receptacle member is fashioned pressable against parts of the loading station, a pressure member being provided for this pressing.

9. The cathode sputtering system of claim 8, wherein the substrate receptacle member is fashioned pressable against parts of the unloading station, the pressure member being provided for this pressing.

10. A cathode sputtering apparatus, comprising:
   a vacuum chamber;
   at least one sputtering cathode operatively attached to and in communication with said chamber;
   loading means for conveying a substrate to be coated into said chamber;
   unloading means for removing said substrate from said chamber; and
   conveying means for conveying said substrate from said loading means to said cathode and from said cathode to said unloading means, said conveying means comprising a rotatable member having at least one arm member projecting radially therefrom and a substrate receptacle member attached to a radial end of the arm member, the arm member being constructed in resilient fashion so that said receptacle member is axially movable along an axis of said sputtering cathode.

11. The cathode sputtering apparatus of claim 10, wherein the arm of the conveying means includes a pair of parallel arm elements.

12. The cathode sputtering apparatus of claim 10, wherein the arm of the conveying means comprises a pair of leaf springs.

13. The cathode sputtering apparatus of claim 10, further including means for pressing said substrate receptacle member against a wall of said chamber.

14. A cathode sputtering apparatus, comprising:
   a vacuum chamber;
   at least one sputtering cathode station including a cathode operatively attached to and in communication with said chamber;
   a loading station including means for conveying a substrate into said chamber operatively attached to and in communication with said chamber;
   an unloading station including means for removing a substrate from said chamber operatively attached to and in communication with said chamber; and
   a conveyor spoon apparatus mounted within said chamber for conveying a substrate from one station to another, said conveyor spoon apparatus including a rotatable disk operatively mounted within said chamber, a drive for rotating said disk in discrete steps, and at least one conveyor spoon having an arm projecting radially from said disk and a receptacle attached to a radial end of said arm, said receptacle including means for receiving and holding a substrate, said arm being constructed of a resilient member so as to permit said receptacle to move axially relative to an axis of rotation of said disk.

15. The cathode sputtering apparatus of claim 14, wherein the arm comprises a pair of parallel leaf springs.

16. The cathode sputtering device of claim 14, further comprising a member cooperating with said receptacle for pressing said receptacle against a wall of said chamber.

17. The cathode sputtering apparatus of claim 14, wherein the receptacle comprises a circular plate having a plurality of openings therethrough.

18. The cathode sputtering apparatus of claim 14, comprising a plurality of cathode stations.

* * * * *